(12) United States Patent
Suyama

(10) Patent No.: US 12,720,883 B2
(45) Date of Patent: Aug. 25, 2026

(54) IMAGE PICKUP UNIT, ENDOSCOPE, AND METHOD FOR MANUFACTURING IMAGE PICKUP UNIT

(71) Applicant: OLYMPUS CORPORATION, Tokyo (JP)

(72) Inventor: Takuro Suyama, Ina (JP)

(73) Assignee: OLYMPUS CORPORATION, Tokyo (JP)

( * ) Notice: Subject to any disclaimer, the term of this patent is extended or adjusted under 35 U.S.C. 154(b) by 388 days.

(21) Appl. No.: 18/382,579

(22) Filed: Oct. 23, 2023

(65) Prior Publication Data

US 2024/0047500 A1 Feb. 8, 2024

Related U.S. Application Data

(63) Continuation of application No. PCT/JP2021/028208, filed on Jul. 29, 2021.

(51) Int. Cl.
*H10F 39/12* (2025.01)
*H04N 23/50* (2023.01)
*H10F 39/00* (2025.01)

(52) U.S. Cl.
CPC ......... *H10F 39/199* (2025.01); *H04N 23/555* (2023.01); *H10F 39/024* (2025.01); *H10F 39/811* (2025.01)

(58) Field of Classification Search
None
See application file for complete search history.

(56) References Cited

U.S. PATENT DOCUMENTS

2008/0277793 A1* 11/2008 Noma ................. H01L 23/3114 257/E21.585
2012/0146173 A1* 6/2012 Ohta ..................... H10F 39/809 257/E31.124

FOREIGN PATENT DOCUMENTS

| | | | |
|---|---|---|---|
| CN | 103367382 | A | 10/2013 |
| JP | 2012164870 | A | 8/2012 |
| JP | 6315859 | B2 | 4/2018 |
| JP | 2020198374 | A | 12/2020 |
| JP | 2021068778 | A | 4/2021 |
| JP | 2021068832 | A | 4/2021 |
| WO | 2021186519 | A1 | 9/2021 |

OTHER PUBLICATIONS

International Search Report dated Sep. 21, 2021 issued in PCT/JP2021/028208.

* cited by examiner

*Primary Examiner* — Hung K Vu
(74) *Attorney, Agent, or Firm* — Scully, Scott, Murphy & Presser, P.C.

(57) ABSTRACT

An image pickup unit includes: a bonded device provided with a light receiving surface, an undersurface, and four side faces, the bonded device including a light receiving element provided with a light receiving circuit, and a circuit element provided with a peripheral circuit and direct-bonded to the light receiving element; a first protective layer covering the four side faces, the first protective layer being made of an inorganic material; a second protective layer covering the first protective layer, the second protective layer being made of metal; and a third protective layer covering the second protective layer, the third protective layer being made of an organic material.

8 Claims, 11 Drawing Sheets

START
WAFER BONDING
S10
FIRST-GROOVE FORMATION
S20
SECOND-GROOVE FORMATION
S30
INSULATING LAYER PLACEMENT
S40
CONDUCTOR LAYER PLACEMENT
S50
SOLDER RESIST FILM PLACEMENT
S60
SOLDER PLACEMENT
S70
CUTTING
S80
END

IMAGE PICKUP UNIT, ENDOSCOPE, AND METHOD FOR MANUFACTURING IMAGE PICKUP UNIT

CROSS REFERENCE TO RELATED APPLICATION

This application is a continuation application of PCT/JP2021/028208 filed on Jul. 29, 2021, the entire contents of which are incorporated herein by this reference.

BACKGROUND OF THE INVENTION

1. Field of the Invention

The present invention relates to an image pickup unit that includes a bonded device made up of direct-bonded two semiconductor devices, an endoscope containing the image pickup unit that includes the bonded device made up of the direct-bonded two semiconductor devices, and a method for manufacturing the image pickup unit that includes the bonded device made up of the direct-bonded two semiconductor devices.

2. Description of the Related Art

Japanese Patent Application Laid-Open Publication No. 2012-164870 discloses a high-sensitive back-illuminated image pickup device with a large light-receiving area. The back-illuminated image pickup device is produced by cutting a bonded wafer made up of direct-bonded image pickup device wafer and peripheral circuit wafer. A direct-bonded interface may contain a gap, in principle. Therefore, an image pickup unit that includes an image pickup device, the direct-bonded interface of which is exposed to a cut surface, might be liable to lower reliability.

Japanese Patent No. 6315859 discloses an image pickup unit in which an image pickup device and cover glass are adhered together using an adhesive layer and a cut surface of an interface of the adhesive layer is covered with sealing resin to prevent penetration of moisture through the cut surface.

SUMMARY OF THE INVENTION

An image pickup unit according to an embodiment includes: a bonded device provided with a light receiving surface, an undersurface on a side opposite the light receiving surface, and four side faces, the bonded device including a light receiving element provided with a light receiving circuit, and a circuit element provided with a peripheral circuit and direct-bonded to the light receiving element; a first protective layer covering the four side faces, the first protective layer being made of an inorganic material; a second protective layer covering the first protective layer, the second protective layer being made of metal; and a third protective layer covering the second protective layer, the third protective layer being made of an organic material.

An endoscope according to an embodiment includes an image pickup unit, wherein the image pickup unit includes a bonded device provided with a light receiving surface, an undersurface on a side opposite the light receiving surface, and four side faces, the bonded device including a light receiving element provided with a light receiving circuit, and a circuit element provided with a peripheral circuit and direct-bonded to the light receiving element, a first protective layer covering the four side faces, the first protective layer being made of an inorganic material, a second protective layer covering the first protective layer, the second protective layer being made of metal, and a third protective layer covering the second protective layer, the third protective layer being made of an organic material.

A method for manufacturing an image pickup unit according to an embodiment includes: direct-bonding a first wafer including a light receiving circuit and a second wafer including a peripheral circuit and thereby producing a bonded wafer provided with a light receiving surface and an undersurface on a side opposite the light receiving surface; forming a frame-shaped grooves in the undersurface of the bonded wafer, the grooves surrounding the light receiving circuit and the peripheral circuit, the grooves being deeper than a bonding interface between the first wafer and the second wafer; placing a first protective layer made of an inorganic material in the grooves; and cutting the bonded wafer along the grooves.

DETAILED DESCRIPTION OF THE PREFERRED EMBODIMENTS

First Embodiment

Figure 1:
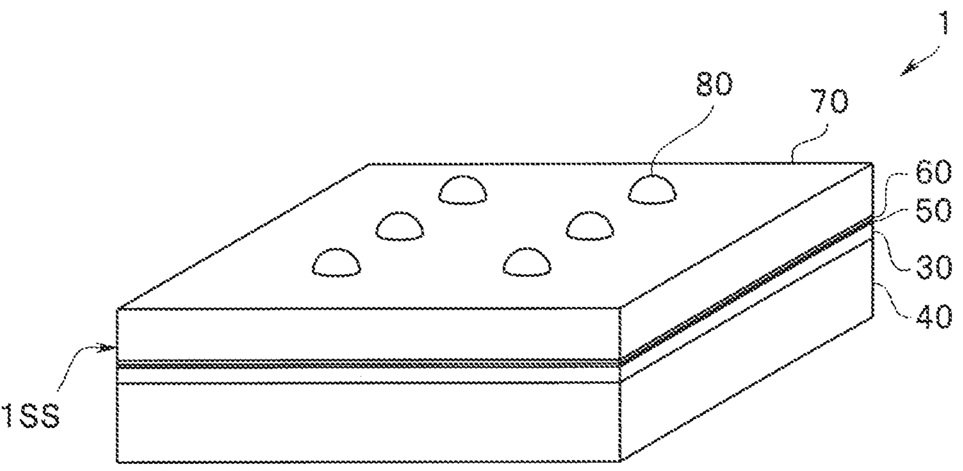
FIG. 1 is a perspective view of an image pickup unit according to a first embodiment.
Figure 2:
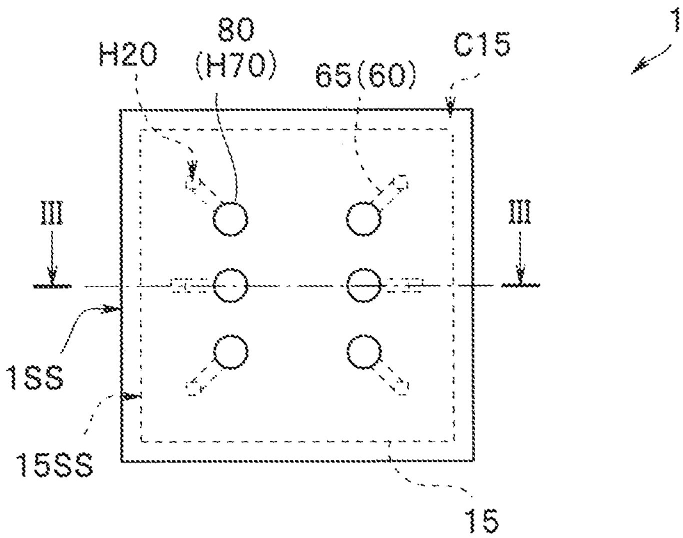
FIG. 2 is a bottom view of the image pickup unit according to the first embodiment.
Figure 3:
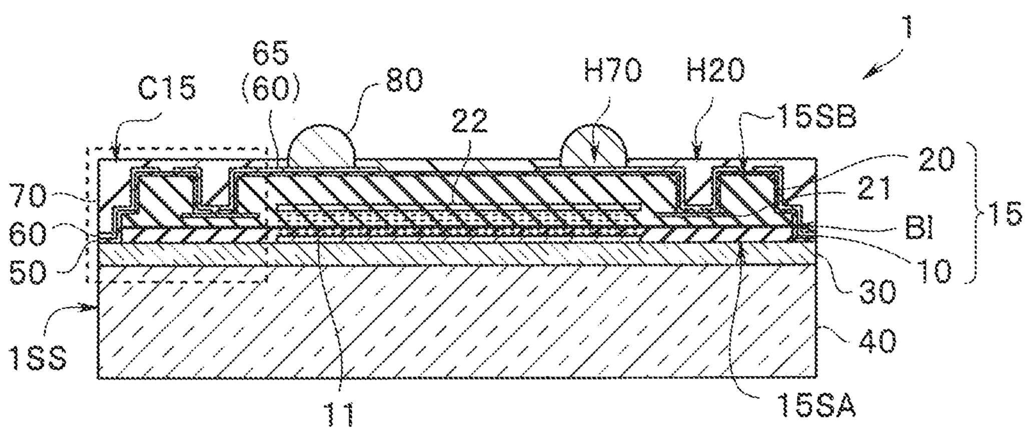
FIG. 3 is a cross-sectional view taken along line III-III in FIG. 2.
Figure 4:
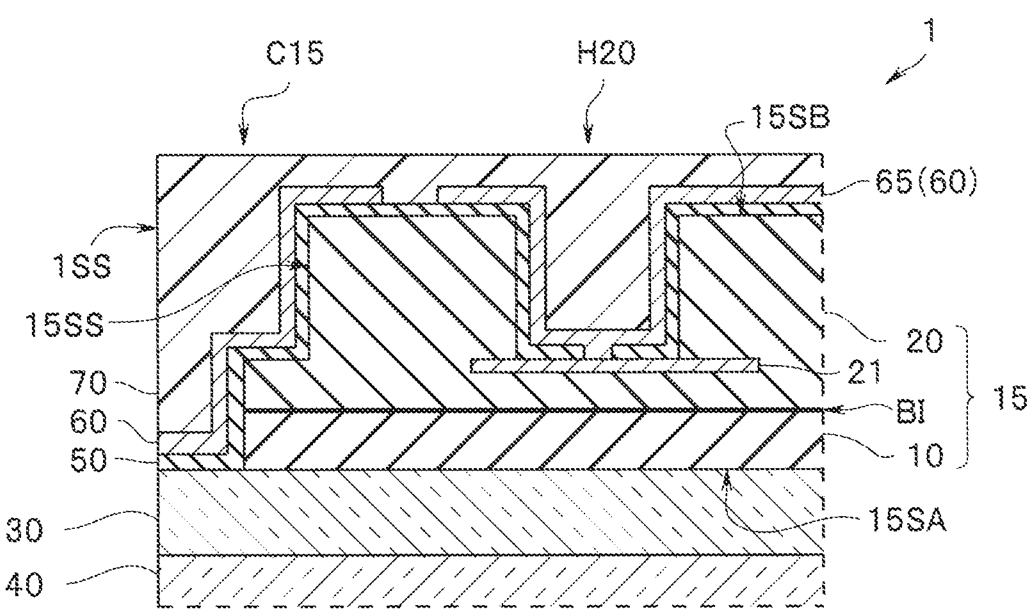
FIG. 4 is a partially enlarged view of FIG. 3.

In the following description, the drawings based on each embodiment are schematic. A relationship between thickness and width of each component as well as thickness ratios and relative angles among individual components are different from actual ones. Some of dimensional relationships or ratios may differ among the drawings. Illustrations of some components are omitted. The direction from which light enters is designated as an upper direction.

As shown in FIGS. 1 to 4, in an image pickup unit 1 according to the present embodiment, a bonded device 15 and cover glass 40 are adhered together using an adhesive layer 30 made of transparent resin.

The bonded device 15 is a back-illuminated image pickup device in which a light receiving element 10 provided with a light receiving circuit 11 and a circuit element 20 provided with a peripheral circuit 22 are direct-bonded. In other words, a first rewiring layer of the light receiving element 10 connected to the light receiving circuit 11 and a second rewiring layer of the circuit element 20 connected to the peripheral circuit 22 are direct-bonded. The bonded device 15 is a substantially rectangular parallelepiped shape, including a light receiving surface 15SA, an undersurface 15SB on a side opposite the light receiving surface 15SA, and four side faces 15SS. The light receiving element 10 includes the light receiving surface 15SA and the circuit element 20 includes the undersurface 15SB.

The cover glass 40 is placed on the light receiving surface 15SA of the light receiving element 10. With an upper surface of the circuit element 20 being bonded to the light receiving element 10, the undersurface 15SB on the side opposite the upper surface is covered with a solder resist film 70. Solder 80 is placed in a hole H70 in the solder resist film 70. The solder 80 is connected to the peripheral circuit 22 through an interconnect layer 65 (conductor layer 60) placed in a via H20.

The bonded device 15 includes a frame-shaped notch C15 provided with a step and provided on outer edges. Notched side faces 15SS are covered with an insulating layer 50, which is a first protective layer made of an inorganic material, the conductor layer 60, which is a second protective layer made of metal, and the solder resist film 70, which is a third protective layer made of an organic material. In other words, a bonding interface BI direct-bonded and exposed to the side faces 15SS of the bonded device 15 is covered with an insulating layer 50. The insulating layer 50 is covered with the conductor layer 60. The conductor layer 60 is covered with the solder resist film 70. The third protective layer may be an organic material, mesoporous organosilica, or an inorganic material such as silicon nitride or silicon oxide, a film of which is formed by plasma CVD.

The side faces 15SS of the bonded device 15 are not exposed to four side faces 1SS of the image pickup unit 1 shaped as a substantially rectangular parallelepiped. In other words, the bonding interface BI is covered with three types of protective layer made of different materials. This increases reliability of the image pickup unit 1.

As described later, the first protective layer combines the insulating layer 50 for use to insulate the interconnect layer 65 from a base body made of silicon. The second protective layer, which is the conductor layer 60, is placed simultaneously with the interconnect layer 65. The solder resist film 70 is essential in order to place the solder 80. The interconnect layer 65 on a wall surface of the via H20 is sandwiched between the insulating layer 50 and the solder resist film 70.

Because the three types of protective layer covering the bonding interface BI is placed to interconnect the solder 80 and the peripheral circuit 22, it is easy to manufacture the image pickup unit 1.

<Method for Manufacturing Image Pickup Unit>

Figure 5:
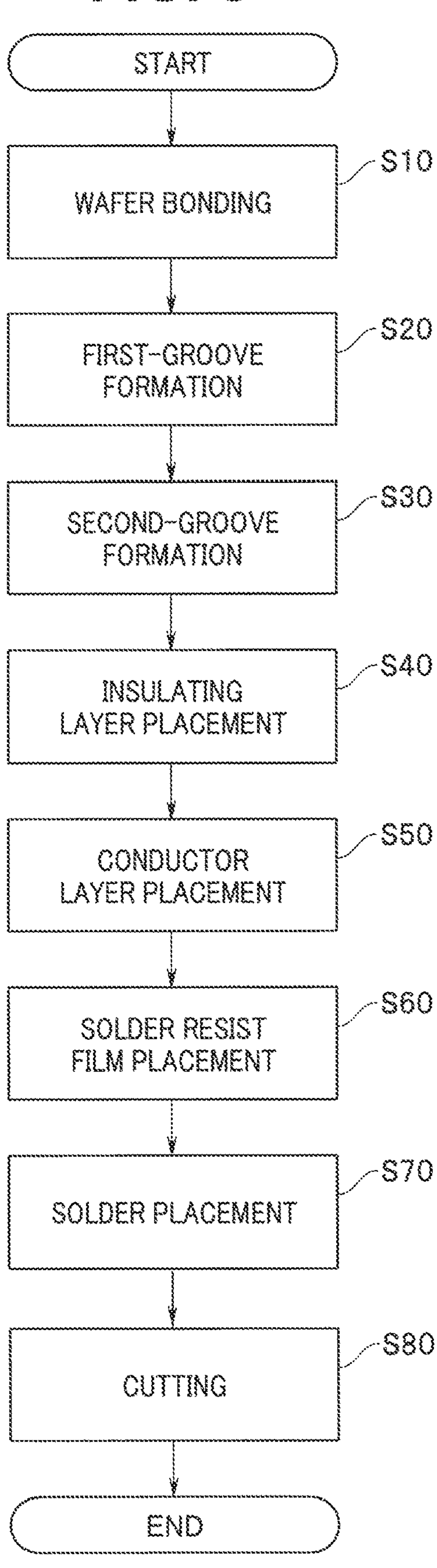
FIG. 5 is a flowchart of a method for manufacturing the image pickup unit according to the first embodiment.

A method for manufacturing the image pickup unit will be described with reference to a flowchart of FIG. 5.

<Step S10> Wafer Bonding

Although not illustrated, using a publicly known semiconductor manufacturing technique, a plurality of the light receiving circuits 11 are placed on a silicon wafer, respective first rewiring layers are placed on the plurality of light receiving circuits 11, and consequently, a first wafer 10W, which is an image pickup device wafer, is produced. The light receiving circuits 11 are CMOS (complementary metal oxide semiconductor) light receiving circuits or CCDs (charge coupled devices). Although not illustrated, color filters, microlenses, and the like are placed on the light receiving circuits 11.

On the other hand, using a publicly known semiconductor manufacturing technique, a plurality of the peripheral circuits 22 are placed on a silicon wafer, respective second rewiring layers are placed on the plurality of peripheral circuits 22, and consequently, a second wafer 20W, which is a peripheral circuit wafer, is produced. The peripheral circuits 22 primarily process output signals of the light receiving circuits 11 and process a drive control signal. The second rewiring layers of the second wafer 20W include internal electrodes 21 connected to the interconnect layer 65.

The first rewiring layer of the first wafer 10W and the second rewiring layer of the second wafer 20W are direct-bonded. The direct-bonding is a bonding form in which atoms exposed to bonding surfaces are bonded together without the use of a bonding member in a bonding interface between two layers to be bonded together.

For example, surface-activated bonding is used for direct-bonding. First, for example, ion milling is done to irradiate the respective bonding surfaces of the first wafer 10W and second wafer 20W with an argon atom beam for 3 minutes, thereby activating the surfaces.

Then, in a high vacuum with an ultimate vacuum of $10^{-4}$ Pa or below, the first wafer 10W and the second wafer 20W are stacked together and pressure-bonded (1 $N/mm^2$) at room temperature for 10 minutes, and then heat-treated at 120° C. for 1 hour.

Preferably, the bonding surfaces are polished flat at the atomic level by CMP (chemical mechanical polishing) or the like. For example, the bonding surfaces are processed to 10 nm or below in terms of surface roughness in maximum height (Rmax) or 1 nm or below in terms of center line average roughness (Ra), where Rmax and Ra are defined by JIS-B0601:2001.

Direct-bonding conditions are selected as appropriate. For example, a plasma irradiation process may be used for activation in surface-activated bonding. Pressure bonding conditions are selected, for example, from the following ranges: a pressure of 0.1 $N/mm^2$ to 10 $N/mm^2$, a duration of 1 minute to 1 hour, a temperature of room temperature to 200° C.

The first wafer 10W of a bonded wafer 15A is processed to be thin. For example, a back grinding step and a CMP (chemical mechanical polishing) step are performed from an upper surface (surface on the side opposite the bonding interface) side of the first wafer 10W.

In the back grinding step, a diamond wheel called a back grinding wheel is used. The CMP step is a polishing process that involves a chemical action and a mechanical action to reduce surface roughness of the surface ground in the back grinding step.

The first wafer 10W is reduced in thickness down to a thickness of 5 μm to 50 μm. Then, a glass wafer 40W is adhered to the light receiving surface 15SA, which is a polished surface, using an adhesive layer 30W. It is sufficient that the glass wafer 40W is transparent in a wavelength band of light used for image pickup, and the glass wafer 40W is made, for example, of borosilicate glass, quartz glass, single-crystal sapphire, or other glass.

The adhesive layer 30W is made of a BCB (benzocyclobutene) resin, an epoxy-based resin, a silicone-based resin, or the like, which has properties such as high transparency (e.g., transmittance at visible wavelengths is 90% or above), high adhesive strength, and high resistance to heat or the like in downstream operations. Regarding a curing method of the adhesive layer 30W, as long as predetermined characteristics are satisfied, any of a heat curing method, a UV curing method, a UV curing method+a heat curing method, a UV curing method+a moisture curing method, and a cold setting method may be used depending on the resin.

Figure 6A:
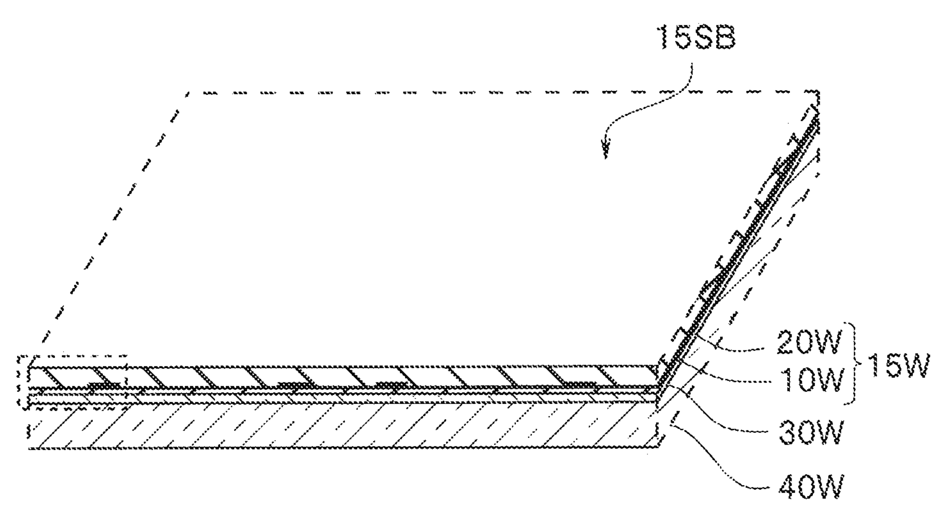
FIG. 6A is a perspective cross-sectional view for explaining the method for manufacturing the image pickup unit according to the first embodiment.
Figure 6B:
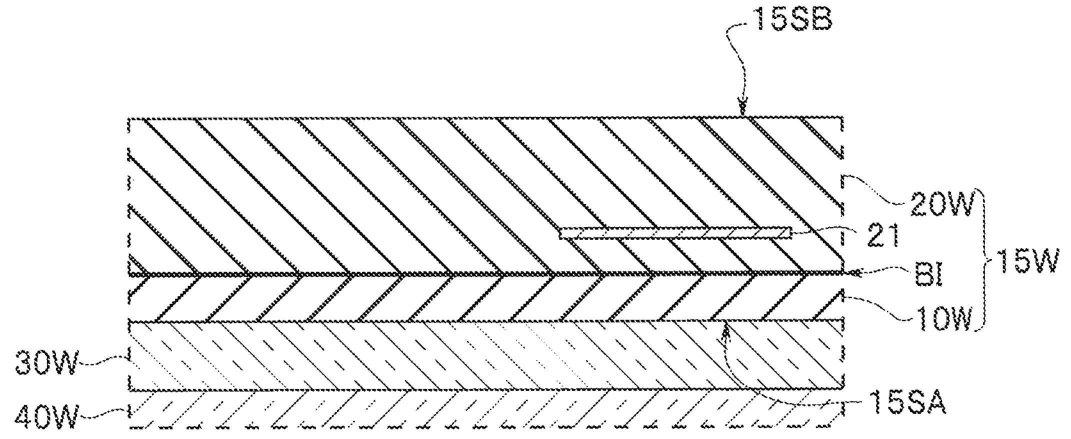
FIG. 6B is a partial cross-sectional view of FIG. 6A.

FIG. 6A shows the bonded wafer 15A, to an upper surface of which the glass wafer 40W is adhered via the adhesive layer 30W. The steps described below are carried out with respect to the undersurface 15SB of the bonded wafer. FIG. 6B is an enlarged cross-sectional view of the part enclosed by a dotted line in the lower left of FIG. 6A.

<Step S20> First-Groove Formation

Figure 7A:
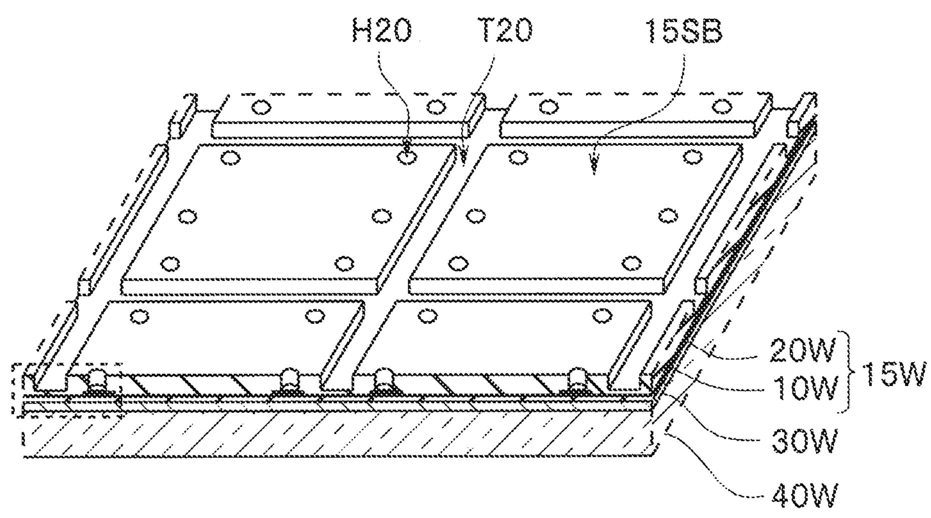
FIG. 7A is a perspective cross-sectional view for explaining the method for manufacturing the image pickup unit according to the first embodiment.
Figure 7B:
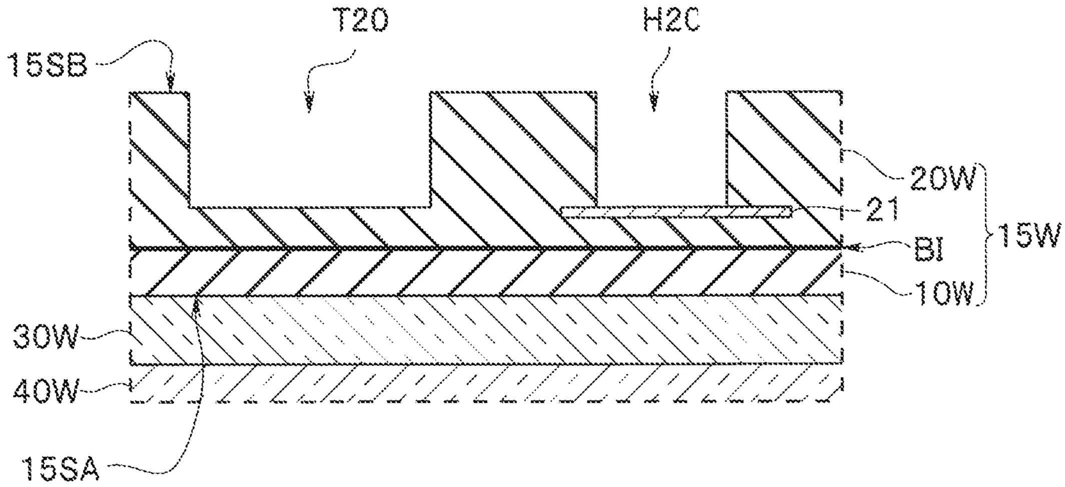
FIG. 7B is a partial cross-sectional view of FIG. 7A.

As shown in FIGS. 7A and 7B, first grooves T20 are formed in a lattice pattern in the undersurface 15SB of the bonded wafer 15W. A plurality of vias (closed-end holes) H20 are formed simultaneously with the formation of the first grooves T20.

Although not illustrated, an etching process is performed after an etching mask is placed on the undersurface 15SB. The etching mask is an inorganic film such as a silicon oxide film or a silicon nitride film, or an organic film of photoresist, polyimide, BCB, or the like.

In the etching process, the first grooves T20 and the vias H20 are formed, for example, by wet etching using an alkaline solution such as KOH or TMAH or by dry etching using ICP-RIE.

The internal electrodes 21 of the second wafer 20W serve as etch-stop layers for the vias H20. The first grooves T20, the etching of which is finished simultaneously with the vias H20, is substantially equal in depth to the vias H20, and thus, the first grooves T20 do not reach the bonding interface BI.

<Step S30> Second-Groove Formation

Figure 8A:
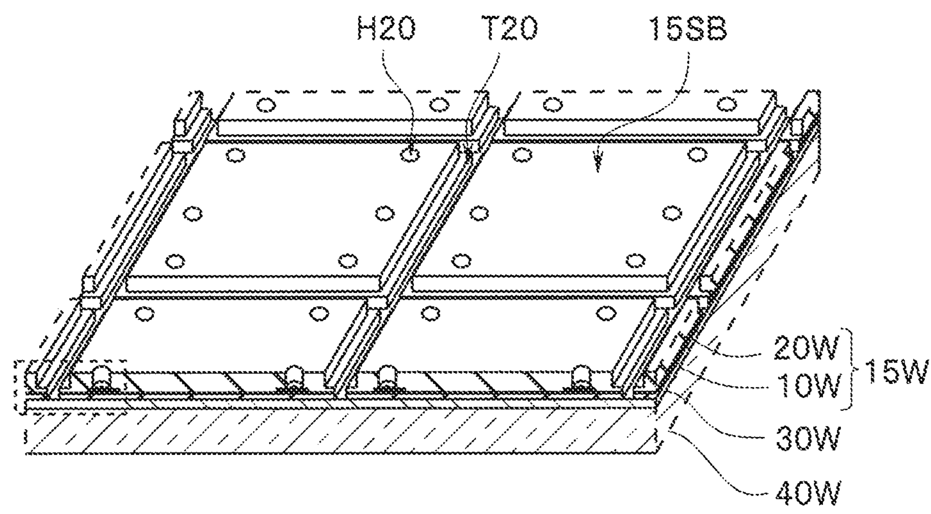
FIG. 8A is a perspective cross-sectional view for explaining the method for manufacturing the image pickup unit according to the first embodiment.
Figure 8B:
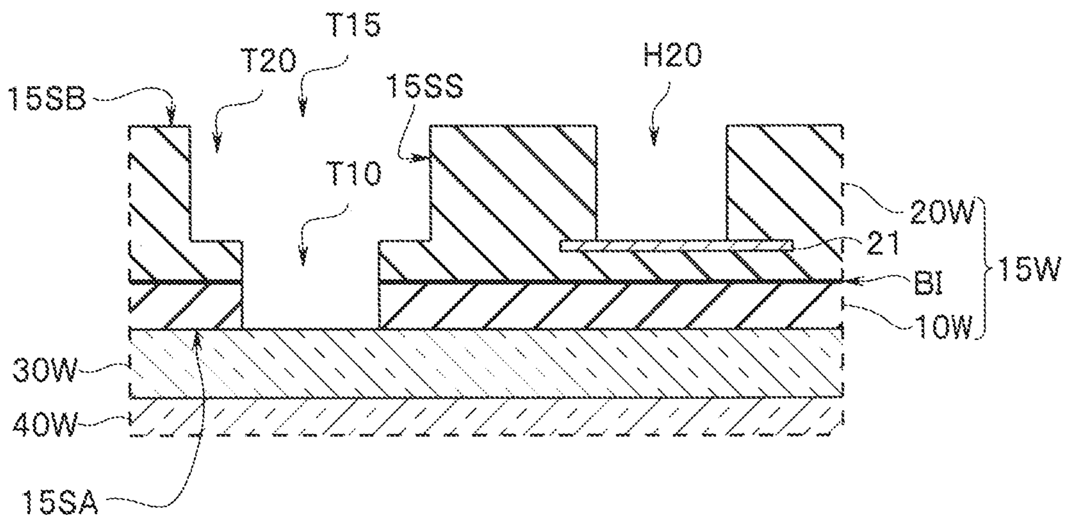
FIG. 8B is a partial cross-sectional view of FIG. 8A.

As shown in FIGS. 8A and 8B, second grooves T10, deeper than the bonding interface BI, are formed in a lattice pattern along bottom faces of the first grooves T20. Therefore, grooves T15 have a plane parallel to the light receiving surface 15SA, which was the bottom faces of the first grooves T20.

Regarding a method for forming the second grooves T10, for example, an ion milling process or a blade dicing process is used. The second grooves T10 penetrate the first wafer 10W, and have bottom faces that are the adhesive layer 30W.

The first grooves T20 in which the second grooves T10 are formed are referred to as the grooves T15. It is sufficient if the grooves T15 are at least deeper than the bonding interface BI.

The second grooves T10 are deeper than the bonding interface BI, but can be formed in a short period of time because the second grooves T10 are formed in the bottom faces of the first grooves T20, which are formed simultaneously with the vias H20.

As described later, the bottom faces of the grooves may be located either on the first wafer 10W or on the glass wafer 40W. If the step of first-groove formation is carried out separately from the formation of the vias H20, to a depth at least greater than the bonding interface BI using a dicing blade, it is unnecessary to form the second grooves.

<Step S40> Insulating Layer Placement

Figure 9:
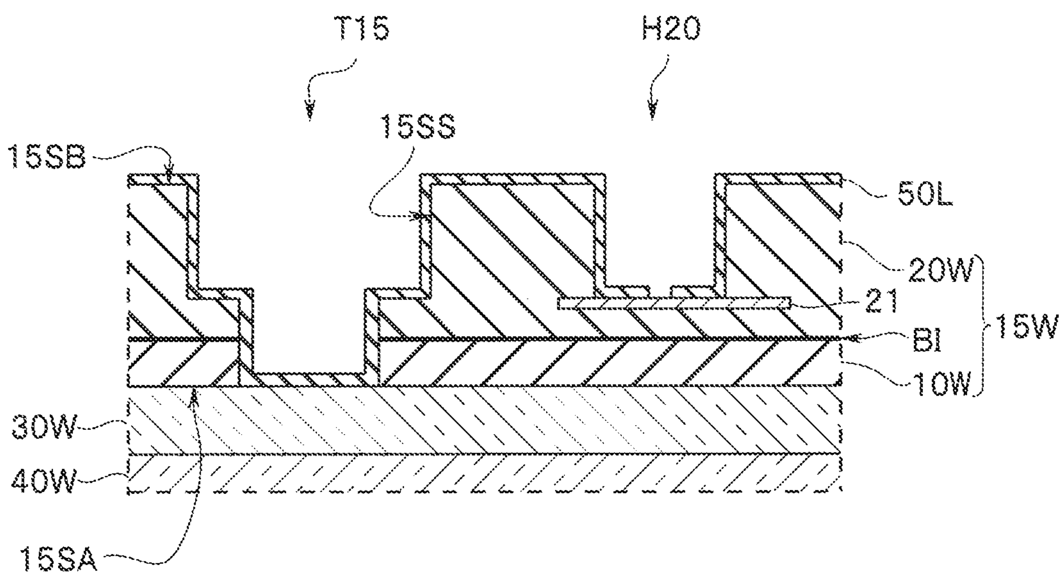
FIG. 9 is a partial cross-sectional view for explaining the method for manufacturing the image pickup unit according to the first embodiment.

As shown in FIG. 9, an insulating layer 50L, which is a first protective layer made of an inorganic material, is placed on the entire undersurface 15SB of the bonded wafer 15W. The side faces 15SS of the grooves T15 are also covered with the insulating layer 50L used to place through wirings on the wall surfaces and bottom faces of the vias H20. The insulating layer 50L is 0.1 μm to 3 μm thick.

The insulating layer 50L is, for example, a silicon oxide film or a silicon nitride film formed using plasma CVD, photo-CVD, or the like. The film formation processes are low-temperature processes, and thus tetraethoxysilane (TEOS), octamethylcyclotetrasiloxane (OMCTS), or the like is used as a source gas in forming a silicon oxide film. In forming a silicon nitride film, a mixed gas such as $SiH_4+NH_3$, $SiH_2CL_2+NH_3$, $SiH_4+N_2$, or $SiH_4+NH_3+N_2$ is used as a source gas.

Openings are formed in the insulating layer 50L on the bottom faces of the vias H20 using, for example, the ion milling process.

<Step S50> Conductor Layer Placement

Figure 10:
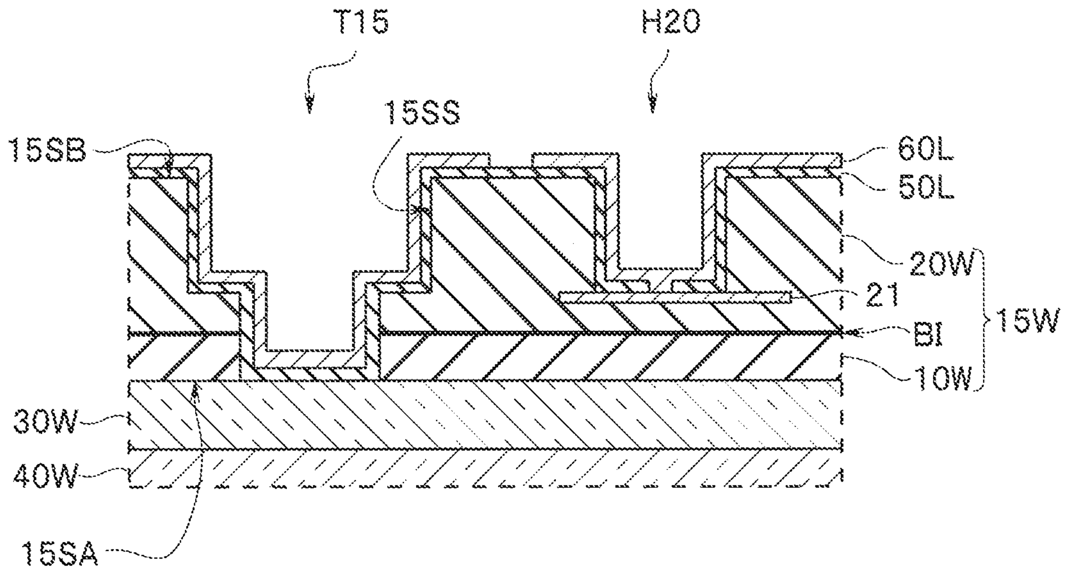
FIG. 10 is a partial cross-sectional view for explaining the method for manufacturing the image pickup unit according to the first embodiment.

As shown in FIG. 10, a conductor layer 60L, which is a second protective layer made of metal, is placed, covering the insulating layer 50L. The conductor layer 60L, which is made of aluminum or copper, is placed using, for example, a sputtering process or a vapor deposition process. The conductor layer 60L may be placed using a plating process after a seed layer is placed by the sputtering process or the vapor deposition process. The conductor layer 60L is 1 μm to 10 μm thick.

The conductor layers 60L placed in the vias H20 are electrically connected to the internal electrodes 21. Although not illustrated, the conductor layers 60L extended from the plurality of vias H20 each undergoes patterning to become the interconnect layers 65 insulated from one another. The side faces 15SS of the grooves T15 are also covered with the conductor layers 60L used to place through wirings in the vias H20.

<Step S60> Solder Resist Film Placement

Figure 11A:
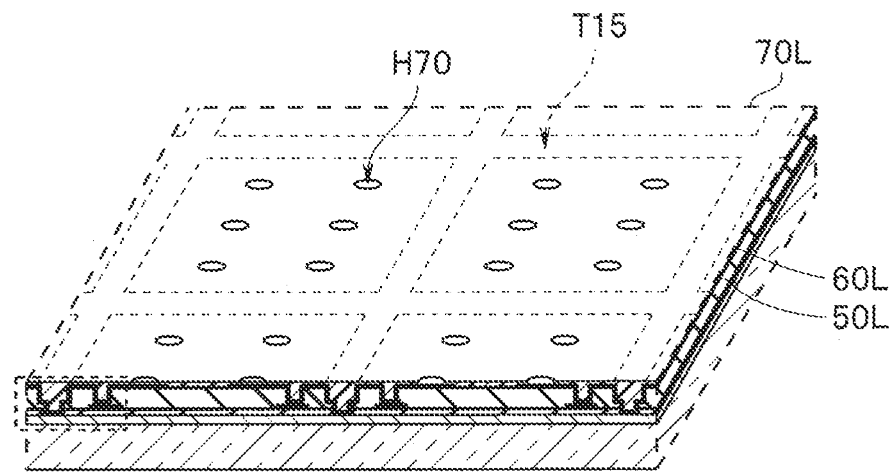
FIG. 11A is a perspective cross-sectional view for explaining the method for manufacturing the image pickup unit according to the first embodiment.
Figure 11B:
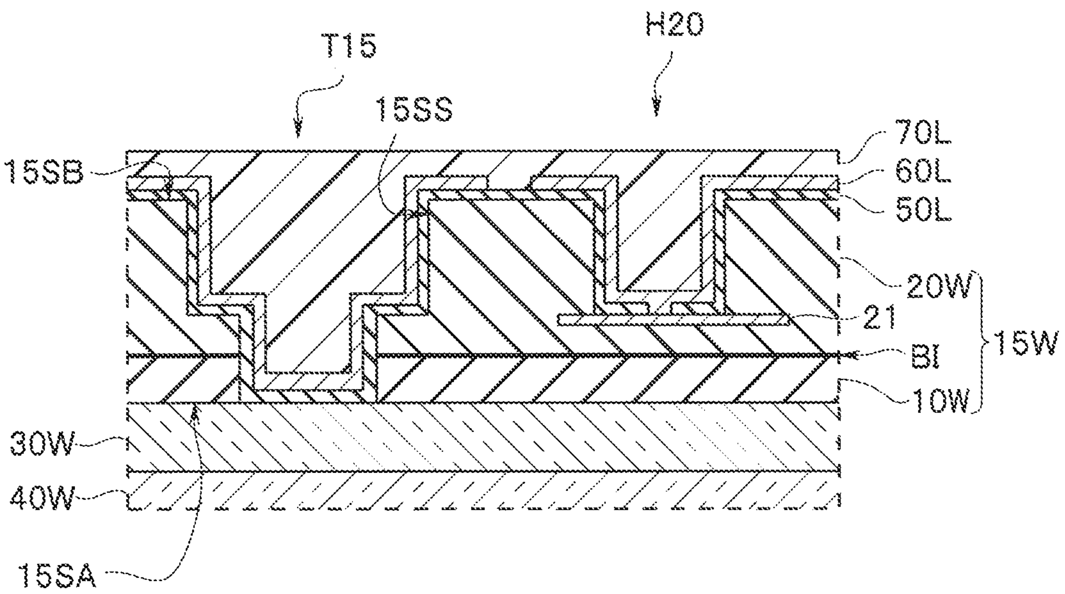
FIG. 11B is a partial cross-sectional view of FIG. 11A.

As shown in FIGS. 11A and 11B, a solder resist film 70L, which is a third protective layer made of an organic material, is placed. The solder resist film 70L is placed by spin coating, spray coating, screen printing, or the like, covering the patterned conductor layers 60L (interconnect layers 65). The solder resist film 70L made of a resin such as polyimide, is a solder mask used to prevent solder from spreading in a solder placement step S70 described later.

Holes H70 are provided in the solder resist film 70L at locations corresponding to the conductor layers 60L extended from respective ones of the plurality of vias H20. The side faces 15SS of the grooves T15 are also covered by the solder resist film 70L for use to place the solder 80.

The solder resist film 70L is 1 μm to 30 μm thick. Note that it is not necessary that the vias H20 and the grooves T15 are filled with the solder resist film 70L. For example, there may be elongated recesses along the grooves T15 on a surface of the solder resist film 70L.

<Step S70> Solder Placement

As shown in FIG. 12, the solder 80 is placed in the holes H70 in order to electrically connect to the outside world. Solder balls or the like are used as the solder 80.

<Step S80> Cutting

Figure 12A:
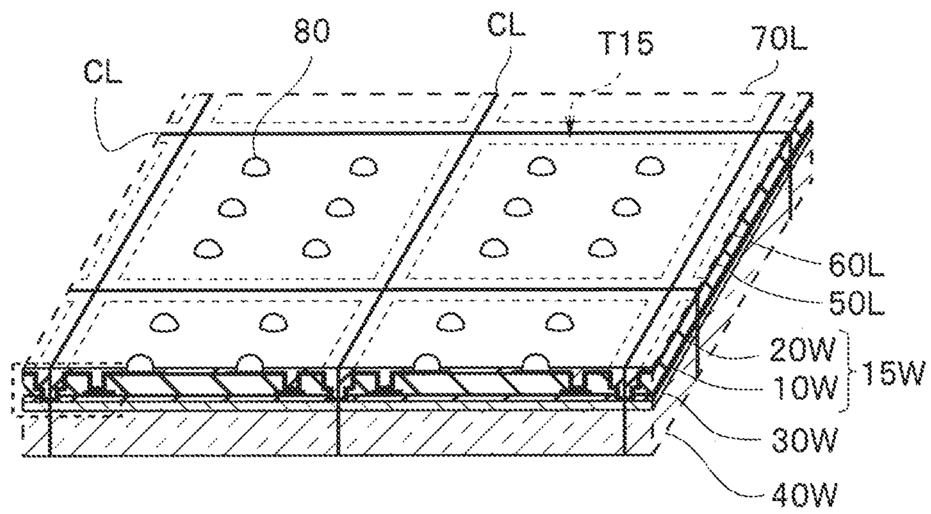
FIG. 12A is a perspective cross-sectional view for explaining the method for manufacturing the image pickup unit according to the first embodiment.
Figure 12B:
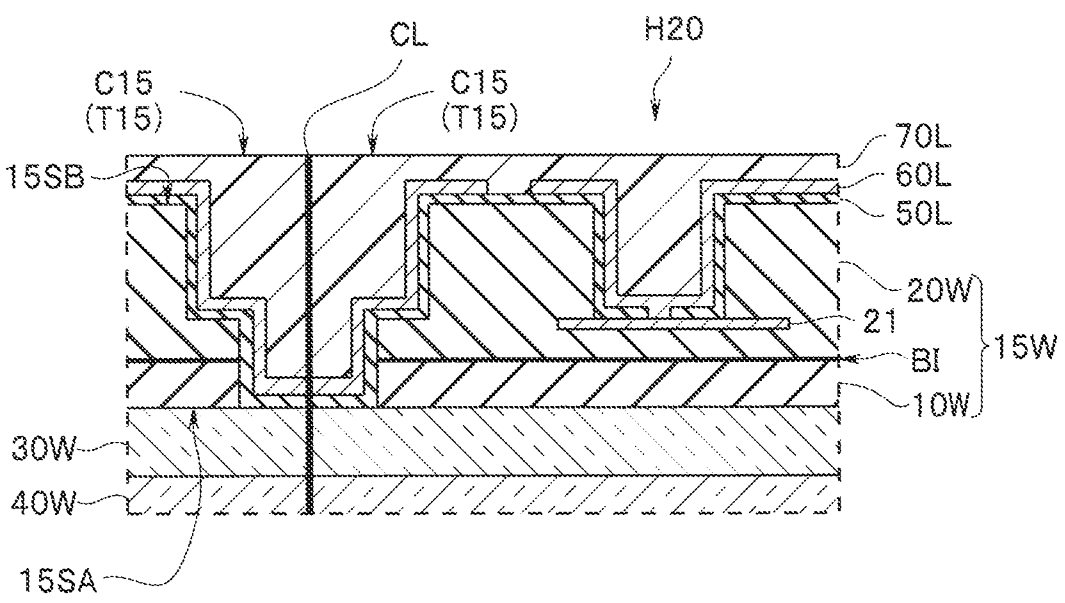
FIG. 12B is a partial cross-sectional view of FIG. 12A.

As shown in FIGS. 12A and 12B, the bonded wafer 15W is cut along the lattice-patterned grooves T15, i.e., along cutting lines CL.

Note that by adhering a stacked lens wafer including a plurality of lens unit to the glass wafer 40W before the cutting step, the bonded wafer 15W may be cut together with the stacked lens wafer.

The bonded wafer 15W is diced into a plurality of the image pickup units 1. The image pickup unit 1 does not have the bonding interface BI exposed to the side faces which are diced surfaces. The bonding interface BI is covered with the insulating layer 50L, which is a first protective layer made of an inorganic material, the conductor layer 60L, which is a second protective layer made of metal, and the solder resist film 70L, which is a third protective layer made of an organic material.

With the method for manufacturing the image pickup unit 1 according to the present embodiment, since the bonding interface BI is covered with three different types of material (inorganic material, metal material, and organic material), the image pickup unit 1 can be made highly reliable. Because an etching step, an insulating layer placement step, a conductor layer placement step, and a solder resist film placement step used to place electrical interconnects in the image pickup unit 1 allow the bonding interface BI to be protected, it is easy to implement the method for manufacturing the image pickup unit 1 according to the present embodiment.

Modifications of First Embodiment

Image pickup units 1A to 1C according to modifications of the first embodiment have effects similar to the effects of the image pickup unit 1. Therefore, components having the same functions as the image pickup unit 1 are denoted by the same reference numerals as the corresponding components of the image pickup unit 1, and description thereof will be omitted.

Modification 1 of First Embodiment

Figure 13:
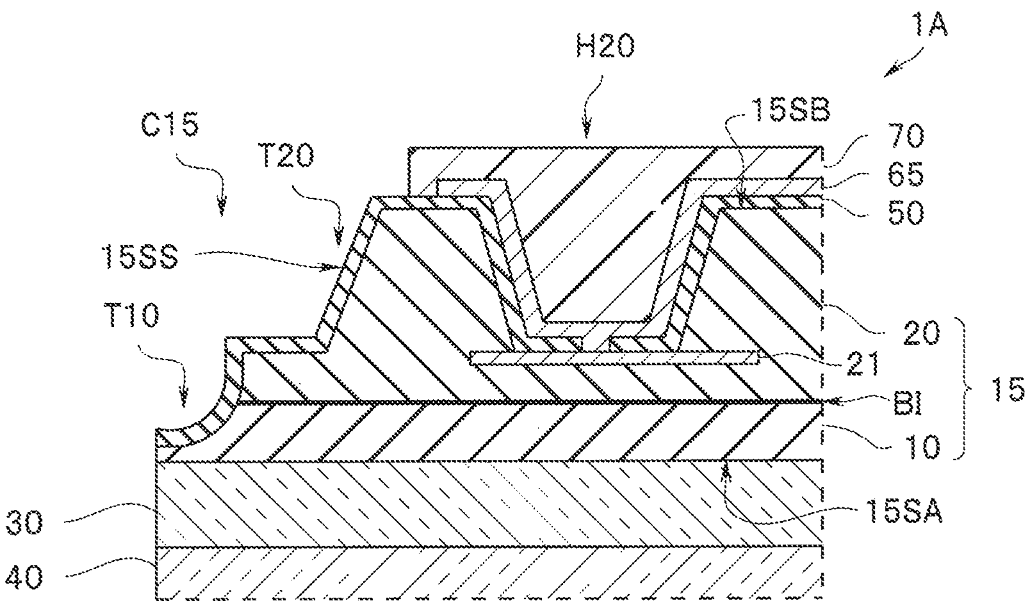
FIG. 13 is a partial cross-sectional view of an image pickup unit according to Modification 1 of the first embodiment.

In the image pickup unit 1A according to the present modification shown in FIG. 13, the side faces of the bonding interface BI are covered only with the insulating layer 50, which is a first protective layer made of an inorganic material.

In the image pickup unit 1A, since the first grooves T20 and the vias H20 are formed by a wet etching process, wall surfaces are tilted. Bottom faces of the second grooves T10 formed by a dicing blade with a curved tip is located in the light receiving element 10.

The image pickup unit 1A is higher in reliability than the image pickup unit 1, which has the side faces of the bonding interface BI exposed. The image pickup unit 1A, which is free of the need to cut the conductor layer 60 and the solder resist film 70, requires a shorter time for the cutting step than the image pickup unit 1.

Modification 2 of First Embodiment

Figure 14:
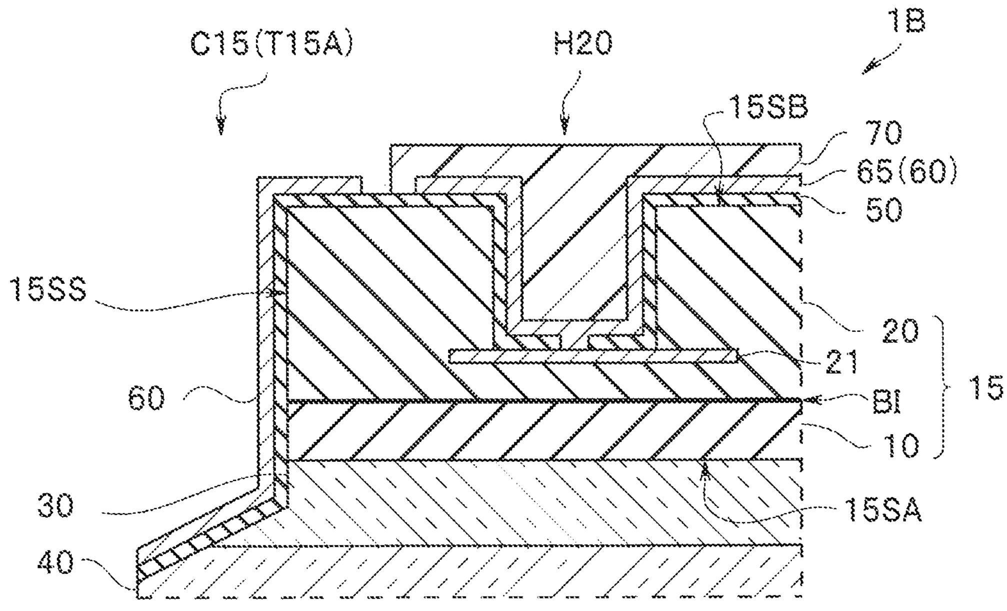
FIG. 14 is a partial cross-sectional view of an image pickup unit according to Modification 2 of the first embodiment.

In the image pickup unit 1B according to the present modification shown in FIG. 14, the side faces of the bonding interface BI are covered with the insulating layer 50, which is a first protective layer made of an inorganic material. The insulating layer 50 is covered with the conductor layer 60, which is a second protective layer made of metal.

Apart from the formation of the vias H20, the image pickup unit 1B has grooves T15A formed by a dicing blade with a V-shaped tip, where the grooves T15A are to become notches C15. Bottom faces of the grooves T15A are located in the cover glass 40. The notches C15 do not have a plane parallel to the light receiving surface 15SA.

The image pickup unit 1B is higher in reliability than the image pickup unit 1A. The image pickup unit 1B, which is free of the need to cut the solder resist film 70, requires a shorter time for the cutting step than the image pickup unit 1.

Modification 3 of First Embodiment

Figure 15:
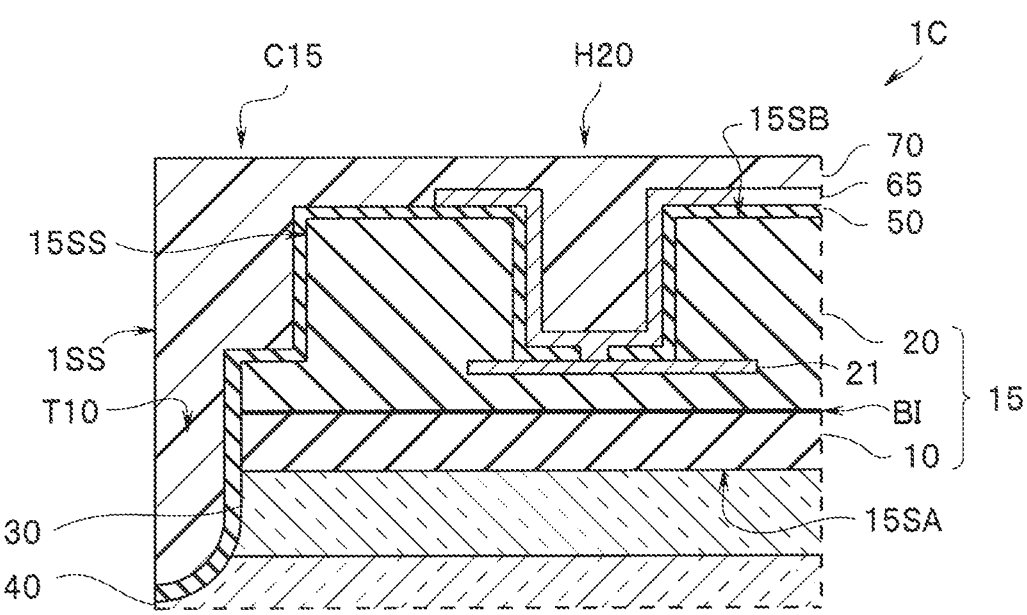
FIG. 15 is a partial cross-sectional view of an image pickup unit according to Modification 3 of the first embodiment.

In the image pickup unit 1C according to the present modification shown in FIG. 15, the side faces of the bonding interface BI are covered with the insulating layer 50, which is a first protective layer made of an inorganic material. The insulating layer 50 is covered with the solder resist film 70, which is a third protective layer made of an organic material.

The second grooves T10, which are to become the notches C15 of the image pickup unit 1C, is formed by a dicing blade with a curved tip. The bottom faces of the grooves T15 are located in the cover glass 40.

The image pickup unit 1C is higher in reliability than the image pickup unit 1A. The image pickup unit 1C, which is free of the need to cut the insulating layer 50, requires a shorter time for the cutting step than the image pickup unit 1.

In the image pickup unit 1, the shape of the notches C15, i.e., the shapes of the first grooves T20 and second grooves T10, may be the same as any of the image pickup units 1A to 1C. On the other hand, the shape of the notches C15, in the image pickup units 1A to 1C may be the same as the image pickup unit 1.

Second Embodiment

Figure 16:
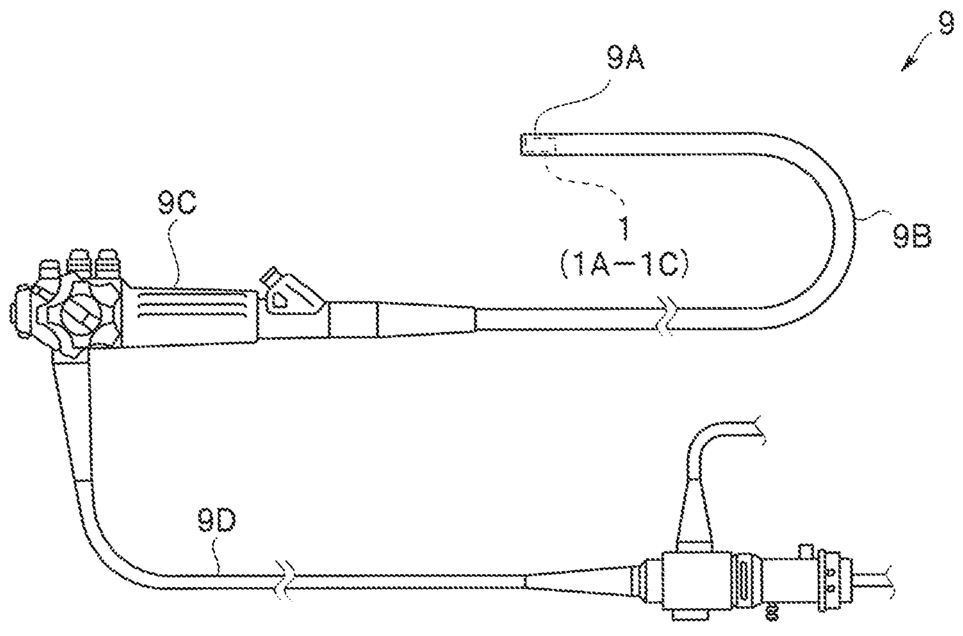
FIG. 16 a perspective view of an endoscope according to a second embodiment.

As shown in FIG. 16, an endoscope 9 according to the present embodiment includes a distal end portion 9A, an insertion portion extended from the distal end portion 9A, an operation portion 9C disposed on a proximal end side of the insertion portion 9B, and a universal cord 9D extending form the operation portion 9C.

The image pickup unit 1 (1A to 1C) is disposed on the distal end portion 9A. An image pickup signal outputted from the image pickup unit 1 is transmitted to a processor (not shown) through a cable passing through the universal cord 9D. A drive signal from the processor to the image pickup unit 1 is also transmitted through a cable passing through the universal cord 9D.

As already described, the image pickup unit 1 (1A to 1C) has high reliability. Consequently, the endoscope 9 has high reliability as well.

The endoscope 9 may be either a flexible endoscope, the insertion portion 9B of which is flexible or a rigid endoscope, the insertion portion 9B of which is rigid. The use of the endoscope 9 may be either medical or industrial.

The present invention is not limited to the embodiments and the like described above, and various alterations, combinations, and applications are possible without departing from the gist of the invention.

What is claimed is:

1. An image pickup unit comprising:

a bonded device provided with a light receiving surface, an undersurface on a side opposite the light receiving surface, and four side faces, the bonded device including a light receiving element provided with a light receiving circuit, and a circuit element provided with a peripheral circuit and direct-bonded to the light receiving element;

a first protective layer covering the four side faces, the first protective layer being made of an inorganic material;

a second protective layer covering the first protective layer, the second protective layer being made of metal; and a third protective layer covering the second protective layer, the third protective layer being made of an organic material.

2. The image pickup unit according to claim 1, wherein cover glass is adhered to the light receiving surface using an adhesive layer.

3. The image pickup unit according to claim 1, wherein the bonded device includes a frame-shaped notch provided with a step and provided on outer edges.

4. The image pickup unit according to claim 1, wherein:

the circuit element includes a via in which an interconnect is placed, the interconnect being electrically connected to the light receiving element; and the interconnect on a wall surface of the via is sandwiched between the first protective layer and the third protective layer.

5. An endoscope comprising an image pickup unit, wherein the image pickup unit includes:

a bonded device provided with a light receiving surface, an undersurface on a side opposite the light receiving surface, and four side faces, the bonded device including a light receiving element provided with a light receiving circuit, and a circuit element provided with a peripheral circuit and direct-bonded to the light receiving element;

a first protective layer covering the four side faces, the first protective layer being made of an inorganic material;

a second protective layer covering the first protective layer, the second protective layer being made of metal; and a third protective layer covering the second protective layer, the third protective layer being made of an organic material.

6. A method for manufacturing an image pickup unit, comprising:

direct-bonding a first wafer including a light receiving circuit and a second wafer including a peripheral circuit to produce a bonded wafer provided with a light receiving surface and an undersurface on a side opposite the light receiving surface;

forming frame-shaped grooves in the undersurface of the bonded wafer, the grooves surrounding the light receiving circuit and the peripheral circuit, the grooves being deeper than a bonding interface between the first wafer and the second wafer;

placing a first protective layer made of an inorganic material in the grooves;

cutting the bonded wafer along the grooves;

placing a second protective layer in the grooves after placing the first protective layer, the second protective layer covering the first protective layer, the second protective layer being made of metal; and placing a third protective layer covering the second protective layer, the third protective layer being made of an organic material.

7. The method for manufacturing an image pickup unit according to claim 6, wherein:

in forming the grooves, a via is formed using an internal electrode of the second wafer as a bottom face of the via, a first grooves substantially equal in depth to the via is formed, and a second grooves deeper than the bonding interface is formed along the first grooves; and the first protective layer is an insulating layer placed in the via, the second protective layer is an interconnect layer placed in the via, and the third protective layer is a solder resist film placed in the via.

8. The method for manufacturing an image pickup unit according to claim 7, wherein the first grooves are formed using an etching process and the second grooves are formed using a dicing blade.

* * * * *